(12) United States Patent
Mou et al.

(10) Patent No.: US 9,978,978 B2
(45) Date of Patent: May 22, 2018

(54) OLED DISPLAY PANEL AND MANUFACTURING METHOD THEREOF

(71) Applicant: EverDisplay Optronics (Shanghai) Limited, Shanghai (CN)

(72) Inventors: Xin Mou, Shanghai (CN); Chung Che Tsou, Shanghai (CN); Hsin Chih Lin, Shanghai (CN); Bin Zhang, Shanghai (CN)

(73) Assignee: EVERDISPLAY OPTRONICS (SHANGHAI) LIMITED, Shanghai (CN)

( * ) Notice: Subject to any disclaimer, the term of this patent is extended or adjusted under 35 U.S.C. 154(b) by 0 days. days.

(21) Appl. No.: 15/265,343

(22) Filed: Sep. 14, 2016

(65) Prior Publication Data

US 2017/0077200 A1     Mar. 16, 2017

(30) Foreign Application Priority Data

Sep. 14, 2015    (CN) .......................... 2015 1 0582959

(51) Int. Cl.
     *H01L 27/32*      (2006.01)
     *H01L 51/56*      (2006.01)
     *H01L 51/52*      (2006.01)
     *H01L 51/50*      (2006.01)

(52) U.S. Cl.
     CPC ........ *H01L 51/5076* (2013.01); *H01L 51/506* (2013.01)

(58) Field of Classification Search
     CPC . H01L 27/3258; H01L 27/3262; H01L 51/56; H01L 51/5234; H01L 51/5218; H01L 51/5237; H01L 33/502; H01L 51/5036; H01L 51/5072; H01L 51/0032; H01L 51/5076
     See application file for complete search history.

(56) References Cited

U.S. PATENT DOCUMENTS

2008/0122347 A1*   5/2008   Lee ..................... H01L 27/3244
                                                                          313/504
2015/0055061 A1    2/2015   Johnston et al.
2016/0285029 A1*   9/2016   Jeon .................... H01L 51/5203

FOREIGN PATENT DOCUMENTS

CN           104393158 A       3/2015
CN           204188921 U       3/2015

\* cited by examiner

*Primary Examiner* — Caridad Everhart
(74) *Attorney, Agent, or Firm* — Andrew F. Young, Esq.; Lackenbach Siegel, LLP

(57) ABSTRACT

The disclosure relates to the field of OLED display technology, more particularly, to an OLED display panel and a manufacturing method thereof, during the manufacturing process of the OLED display panel, by forming a low gray color shift adjustment layer between the anode and the OLED device layer, and/or between the OLED device layer and the cathode, so as to solve the color shift problem under low gray-scale by adjusting thickness or doping concentration of the low gray color shift adjustment layer, and improve the accuracy of emitting color of the OLED panel.

18 Claims, 4 Drawing Sheets

OLED DISPLAY PANEL AND MANUFACTURING METHOD THEREOF

CROSS-REFERENCE TO RELATED APPLICATIONS

The present application claims priority to and the benefit of Chinese Patent Application No. CN 201510582959.5, filed on Sep. 14, 2015, the entire content of which is incorporated herein by reference.

BACKGROUND OF THE DISCLOSURE

Field of the Disclosure

The disclosure relates to the field of OLED display technology, more particularly, to an OLED display panel and a manufacturing method thereof.

Description of the Related Art

OLED (organic light-emitting diode) has been widely used in digital products due to its features like lightweight and power saving. OLED display technology is different compared with the traditional LCD (liquid crystal display) display mode; OLED display technology needs no backlight and uses very thin organic material coating and glass substrate; the organic materials will shine when electric current passes through. As a display device, the OLED display screen may also be affected by environmental factors; especially in a strong light environment, the display effect of the OLED display screen will also decline.

The OLED controls the output current mainly through a TFT (thin-film transistor), to display different brightness; a structure of the TFT-OLED is as shown in FIG. 1.

Brightness of the OLED with low gray-scale is very low, if brightness of 255 gray-scales is 250 nits, then brightness of 20 gray-scales is about 1 nit, and the corresponding brightness of the sub-pixels of red light and green light is only tens of nits, brightness of sub-pixels of blue light is only about single-digit nits; and the electric current needed by sub-pixels is $10^{-10 \sim 11}$ A, yet off-state leakage current of the TFT is also within the range, therefore the leakage current of the TFT may lighten the OLED and cause the OLED to shine slightly in a black picture; on the other hand, since a certain amount of step voltage still exists in the OLED with a low gray-scale; if cut-in voltage of sub-pixels of R, G and B is different, then pixels with the lowest cut-in voltage is the easiest to be lightened, thus color cast is easy to occur in a low gray-scale.

Therefore, to improve the low gray-scale color cast of the OLED panel, on one hand we should reduce the leakage current of the TFT; on the other hand we should reduce current density of the OLED under low voltage; thus a new technical solution to overcome the above-mentioned technical problems becomes a direction for those skilled in the art to be dedicated to.

SUMMARY OF THE DISCLOSURE

In view of the defects of the prior art, technical solutions of the disclosure provide an OLED display panel and a manufacturing method thereof. The technical solutions add at least one low gray color shift adjustment layer and adjust the thickness or doping concentration of the low gray color shift adjustment layer during the manufacturing process of the OLED display panel, to solve the color shift problem under low gray-scale, and improve the accuracy of emitting color of the OLED panel.

Technical solutions used in the disclosure to solve the above-mentioned technical problems as follows.

An OLED display panel, comprising:
a substrate;
a thin-film transistor, disposed on the substrate;
a planarizing layer, disposed on the thin-film transistor, comprising a through-hole penetrating the planarizing layer;
a first electrode, disposed on the planarizing layer, being electrically connected to the thin-film transistor via the through-hole;
an OLED device layer, disposed on the first electrode;
a second electrode, disposed on the OLED device layer;
a low gray color shift adjustment layer, disposed between the first electrode and the OLED device layer, and/or between the OLED device layer and the second electrode; and
an encapsulating cover, disposed on the second electrode.

Preferably, in the above-mentioned OLED display panel, wherein the first electrode is an anode, and the second electrode is a cathode.

Preferably, in the above-mentioned OLED display panel, wherein the anode is a reflective anode, and the cathode is a semitransparent-and-semireflective cathode.

Preferably, in the above-mentioned OLED display panel, wherein the low gray color shift adjustment layer is doped with one or more dopants.

Preferably, in the above-mentioned OLED display panel, wherein the dopants of the low gray color shift adjustment layer are n-type dopants or p-type dopants.

Preferably, in the above-mentioned OLED display panel, wherein the p-type dopants comprise HAT-CN, $F_4$-TCNQ, TBAHA, $SbCl_5$ or $FeCl_3$.

Preferably, in the above-mentioned OLED display panel, wherein the n-type dopants comprise alkali metal or alkali metal salt.

Preferably, in the above-mentioned OLED display panel, wherein a thickness of the low gray color shift adjustment layer is 0.5~500 nm.

Preferably, in the above-mentioned OLED display panel, wherein the OLED device layer comprises a hole injection layer, a hole transport layer, a emitting layer and an electron transport layer stacked in order from bottom to top.

Preferably, in the above-mentioned OLED display panel, wherein the low gray color shift adjustment layer is positioned between the anode and the hole injection layer, and/or between the electron transport layer and the cathode.

An OLED display panel manufacturing method, comprising:
providing a substrate;
forming a thin-film transistor on the substrate;
forming a planarizing layer with a through-hole therein on the thin-film transistor, wherein the through-hole penetrates the planarizing layer;
forming a first electrode on the planarizing layer to be electrically connected to the thin-film transistor via the through-hole;
forming an OLED device layer on the first electrode;
forming a second electrode on the OLED device layer;
forming an encapsulating cover on the second electrode; and
forming a low gray color shift adjustment layer between the first electrode and the OLED device layer, and/or between the OLED device layer and the second electrode.

Preferably, in the above-mentioned manufacturing method, wherein the OLED device layer forming step comprises:

sequentially forming a hole injection layer, a hole transport layer, an emitting layer and an electron transport layer on the first electrode layer.

Preferably, in the above-mentioned manufacturing method, wherein the low gray color shift adjustment layer is formed between the first electrode and the hole injection layer, and/or between the electron transport layer and the second electrode.

Preferably, in the above-mentioned manufacturing method, wherein the first electrode is an anode, and the second electrode is a cathode.

Preferably, in the above-mentioned manufacturing method, wherein the anode is formed as a reflective anode, and the cathode is formed as a semitransparent-and-semireflective cathode.

Preferably, in the above-mentioned manufacturing method, wherein the low gray color shift adjustment layer comprises one or more plural dopants therein.

Preferably, in the above-mentioned manufacturing method, wherein the dopants are p-type dopants or n-type dopants.

Preferably, in the above-mentioned manufacturing method, wherein the n-type dopants comprise alkali metal or alkali metal salt.

Preferably, in the above-mentioned manufacturing method, wherein the p-type dopants comprise HAT-CN, $F_4$-TCNQ, TBAHA, $SbCl_5$ or $FeCl_3$.

Preferably, in the above-mentioned manufacturing method, wherein a thickness of the low gray color shift adjustment layer is 0.5~500 nm.

The disclosure provides an OLED display panel and a manufacturing method thereof, the technical solutions add a low gray color shift adjustment layer between the anode and the OLED device layer and/or between the OLED device layer and the cathode during the manufacturing process of the OLED display panel, and solve the color shift problem under low gray-scale by adjusting thickness or doping concentration of the low gray color shift adjustment layer, thus improve accuracy of emitting color of the OLED panel.

BRIEF DESCRIPTIONS OF THE DRAWINGS

The accompanying drawings, together with the specification, illustrate exemplary embodiments of the present disclosure, and, together with the description, serve to explain the principles of the present disclosure.

DETAILED DESCRIPTION

Figure 1:
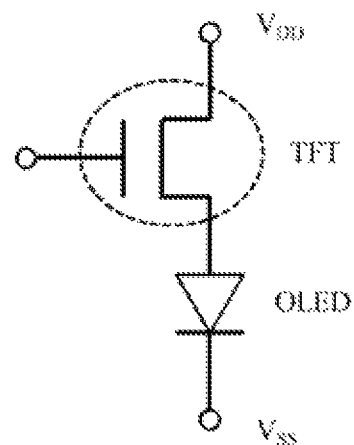
FIG. 1 is a circuit diagram of a traditional OLED controlling output current through a TFT.

The present disclosure will now be described more fully hereinafter with reference to the accompanying drawings, in which exemplary embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. Like reference numerals refer to like elements throughout.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

Embodiment 1

To solve the color shift problem under low gray-scale caused by different cut-in voltage of sub-pixels of the OLED in the prior art, the present disclosure provides an OLED display panel which has a low gray color shift adjustment layer, and solves the color shift problem under low gray-scale through adjusting thickness or doping concentration of the low gray color shift adjustment layer, and improves the accuracy of emitting color of the OLED panel.

Figure 2:
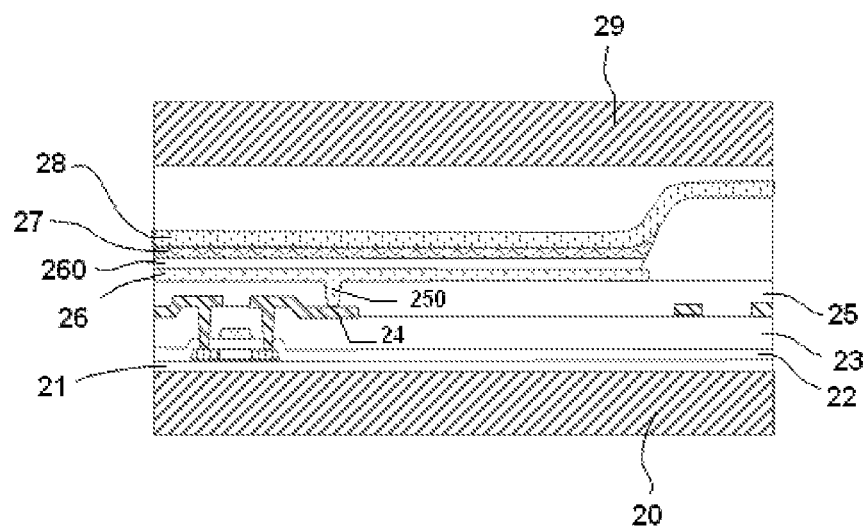
FIGS. 2-4 are structure diagrams of the OLED display panel of the disclosure.

Specifically, a structure as shown in the FIG. 2, the OLED display panel mainly comprises:

a substrate 20; and a buffer layer 21, a gate insulating layer 22 and an insulating layer 23 covering on the substrate 20 in order;

a thin-film transistor 24 configured on the substrate 20; and part of the thin-film transistor 24 is positioned between the gate insulating layer 22 and the insulating layer 23;

a planarizing layer 25 configured on the thin-film transistor 24; and part of the thin-film transistor 24 is positioned in the planarizing layer 25; and the planarizing layer 25 comprises a through-hole 250 penetrating the planarizing layer 25 to the thin-film transistor 24;

a first electrode 26 configured on the planarizing layer 25; and is electrically connected to the thin-film transistor 24 through the through-hole 250;

a low gray color shift adjustment layer 260 configured between the first electrode 26 and an OLED device layer 27, and the current carriers thereof can be successfully injected or transferred to the OLED device layer 27;

the OLED device layer 27, configured on the first electrode 26;

a second electrode 28 configured on the OLED device layer 27; and an encapsulating cover 29 configured on the second electrode 28.

As a preferred embodiment, the first electrode 26 of the embodiment is an anode, and the second electrode 28 is a cathode.

In the embodiment of the disclosure, thickness and doping concentration of the low gray color shift adjustment layer (LGAL for short) 260 can be set properly according to specific process requirements; and as a preferred embodiment, thickness of the low gray color shift adjustment layer 260 is controlled in the range of 0.5~500 nm.

In the embodiment of the disclosure, the low gray color shift adjustment layer 260 may be manufactured using blending or doping process and by means of doping a single organic matter or a single inorganic matter, or two or more organic matters or inorganic matters, or other dopants; the above mentioned dopants may be p-type dopant (such as HAT-CN, $F_4$-TCNQ, TBAHA, $SbCl_5$, $FeCl_3$) or n-type dopant like alkali metal or alkali metal salt (such as Li, Cs and salts thereof). Preferably, ratio of one of the dopants of the low gray color shift adjustment layer 260 is controlled in the range of 0.5% ~20%.

In the embodiment of the disclosure, the first electrode (i.e. the anode) 26 is a reflective anode, the second electrode (i.e. the cathode) 28 is a semitransparent-and-semireflective cathode.

Preferably, the OLED device layer 27 comprises a hole injection layer, a hole transport layer, a emitting layer and an electron transport layer (not shown in the FIG. 2) stacked in order from bottom to top. Wherein, the hole injection layer is positioned on the low gray color shift adjustment layer 260, the second electrode (i.e. the cathode) 28 is positioned on the electron transport layer, that is to say the low gray color shift adjustment layer 260 is positioned between the first electrode (i.e. the anode) 26 and the hole injection layer.

Working Mechanisms:

(1) The OLED display panel comprises the first electrode (i.e. the anode), the LGAL, the OLED device layer, the second electrode (i.e. the cathode); and the LGAL is doped with a constant concentration of p-type dopant (such as $F_4$-TCNQ, etc.).

For the LGAL with different thickness: when voltage is applied to the anode 26 and the cathode 28, since the p-type dopant contains strong electron-withdrawing groups, the LGAL will leave a hole after an electron being attracted from the LGAL; the hole pass through the hole injection layer, the hole transport layer and the emitting layer to form electric current under the applying of the voltage, and then recombinates with electrons transferred from the cathode and the electron transport layer to emit light. The thicker the LGAL is, the more quantity the p-type dopant will be under the condition of having the same ratio of thereof, thus more electrons would be attracted, and more holes would be left, and then the holes move to the emitting layer to form electric current, therefore, by adjusting the thickness of the LGAL layer, the electric current passing through the OLED display panel can be adjusted.

(2) The OLED display panel comprises the first electrode (i.e. the anode), the LGAL, the OLED device layer, the second electrode (i.e. the cathode); and when the thickness of the LGAL is constant (e.g. Both being 5 nm), p-type dopants having different concentration (such as $F_4$-TCNQ, etc.) is doped in the LGAL.

For different doping concentration: when voltage applied to the anode 26 and the cathode 28, since the p-type dopant contains strong electron-withdrawing groups, thus the LGAL will leave a hole after being attracted an electron, and holes pass through the hole injection layer, the hole transport layer and the emitting layer, to form electric current under the appling of the voltage, and then recombinates with electrons transferred from the cathode and the electron transport layer to emit light. The higher the concentration (the change of the concentration can be done by adjusting the ratio of the dopant) of the p-type dopant in the LGAL, the more quantity the p-type dopant will be under the condition of the same proportion thereof, thus more electrons would be attracted, and more holes will be left, and then the holes move to the emitting layer to form electric current, therefore, by adjusting the doping concentration of the LGAL layer, the electric current passing through the OLED display panel can be adjusted.

Figure 5:
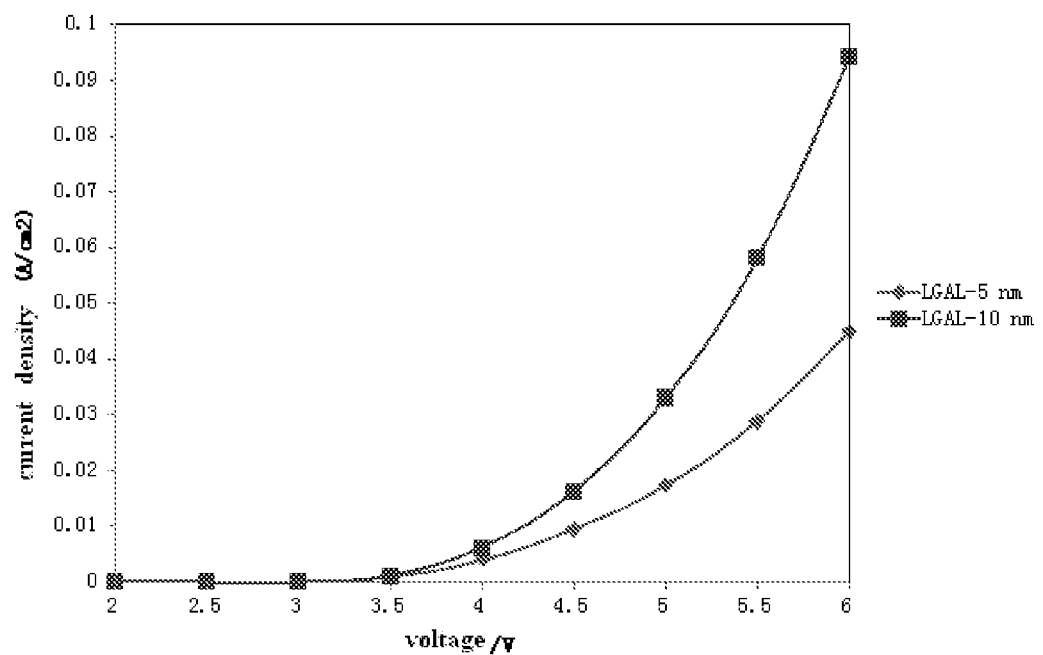
FIG. 5 is a diagram of voltage-current density curve of the OLED of one embodiment of the disclosure.

(3) The curve diagram as shown in the FIG. 5, wherein thickness of the low gray color shift adjustment layer is 5 nm and 10 nm respectively, and FIG. 5 shows voltage and current density characteristic curve with a thickness of 5 nm or 10 nm of the low gray color shift adjustment layer (the lower curve is the voltage and current density characteristic curve with a 5 nm thick low gray color shift adjustment layer, and the upper curve is the voltage and current density characteristic curve with a 10 nm thick low gray color shift adjustment layer); under the same voltage, to increase thickness of the low gray color shift adjustment layer is to increase the current density thereof, and brightness of the OLED display panel, therefore by adjusting the thickness of the low gray color shift adjustment layer, the electric current passing through the OLED display panel can be adjusted, thus the brightness of the OLED display panel can be controlled, so as to control accuracy of emitting color of the OLED display panel, and suppress low gray-scale color shift phenomenon. Wherein corresponding to FIG. 5, when the thickness of the low gray color shift adjustment layer is 5 nm, 10 nm, the current density and voltage values of the device are shown in the following table:

| V | LGAL = 5 nm $J1(A/cm^2)$ | LGAL = 10 nm $J2(A/cm^2)$ | J2/J1 |
|---|---|---|---|
| 2 | 0.00000003 | 0.00000003 | 100% |
| 2.5 | 0.00000003 | 0.00000004 | 133% |
| 3 | 0.00000764 | 0.00001046 | 137% |
| 3.5 | 0.0007543 | 0.0010457 | 139% |
| 4 | 0.00398848 | 0.00612215 | 153% |
| 4.5 | 0.0094101 | 0.01626903 | 173% |
| 5 | 0.01736496 | 0.03304354 | 190% |
| 5.5 | 0.02878946 | 0.05822825 | 202% |
| 6 | 0.04489213 | 0.09423727 | 210% |

Figure 6:
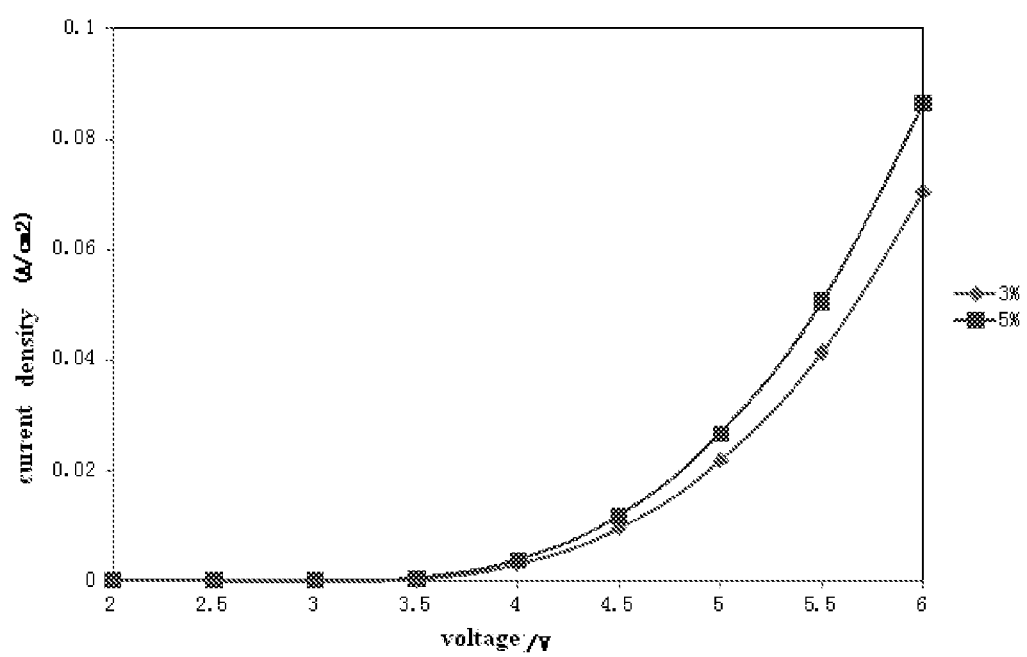
FIG. 6 is a diagram of voltage-current density curve of the OLED of another embodiment of the disclosure.

(4) The curve diagram as shown in the FIG. 6, wherein doping concentration of the low gray color shift adjustment layer is 3% and 5% respectively, so FIG. 6 shows voltage and current density characteristic curve when the doping concentration of the low gray color shift adjustment layer is 3% or 5% (the lower curve is the voltage and current density characteristic curve with 3% doping concentration of the low gray color shift adjustment layer, and the upper curve is the voltage and current density characteristic curve with 5% doping concentration of the low gray color shift adjustment layer). It can be seen from that, under the same voltage, to increase doping concentration of the low gray color shift adjustment layer is to increase current density thereof, and brightness of the OLED display panel, therefore by adjusting the doping concentration of the low gray color shift adjustment layer, the electric current passing through the OLED display panel can be adjusted, thus the brightness of the OLED display panel can be controlled, so as to control the accuracy of emitting color of the OLED display panel, and suppress low gray-scale color shift phenomenon. Wherein, corresponding to the FIG. 6, when doping concentration of the low gray color shift adjustment layer is 3%, 5%, the current density and voltage values of the device are shown in the following table:

| V | 3%<br>J1(A/cm$^2$) | 5%<br>J2(A/cm$^2$) | J2/J1 |
|---|---|---|---|
| 2 | 0.00000003 | 0.00000007 | 233% |
| 2.5 | 0.00000005 | 0.00000008 | 160% |
| 3 | 0.00000522 | 0.00000603 | 116% |
| 3.5 | 0.00043978 | 0.00054578 | 124% |
| 4 | 0.00303487 | 0.00376669 | 124% |
| 4.5 | 0.00962799 | 0.0118208 | 123% |
| 5 | 0.02180617 | 0.02671561 | 123% |
| 5.5 | 0.041382 | 0.0506772 | 122% |
| 6 | 0.07039903 | 0.08649352 | 123% |

Embodiment 2

Figure 3:
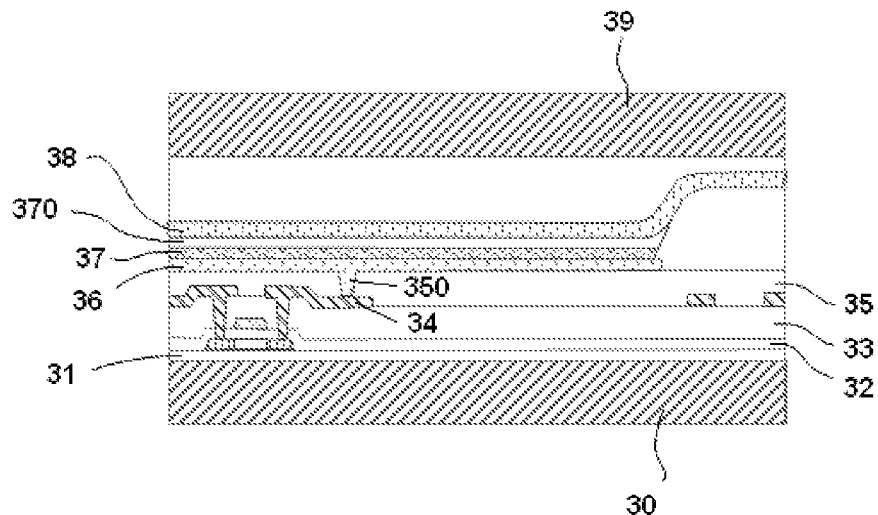

In the embodiments of the disclosure, the technical solution recorded in Embodiment 1 is also applicable for Embodiment 2, so the technical solution of Embodiment 1 will not be repeat here, the obvious differences between Embodiment 2 and Embodiment 1 are: the OLED display panel mainly comprises (as shown in FIG. 3):

a substrate 30; and a buffer layer 31, a gate insulating layer 32 and an insulating layer 33 covering on the substrate 30 in order;

a thin-film transistor 34 configured on the substrate 30, and part of the thin-film transistor 34 is positioned between the gate insulating layer 32 and the insulating layer 33;

a planarizing layer 35 configured on the thin-film transistor 34, and part of the thin-film transistor 34 is positioned in the planarizing layer 35; and the planarizing layer 35 comprises a through-hole 350 penetrating the planarizing layer 35 to the thin-film transistor 34;

a first electrode 36 configured on the planarizing layer 35, and electrically connected to the thin-film transistor 34 through the through-hole 350;

an OLED device layer 37 configured on the first electrode 36;

a low gray color shift adjustment layer 370 configured on the OLED device layer 37, and the current carriers of the low gray color shift adjustment layer 370 can be successfully injected and transferred to the OLED device layer 37;

a second electrode 38 configured on the OLED device layer 37; and an encapsulating cover 39 configured on the second electrode 38.

Wherein, the first electrode 36 is an anode, the second electrode 38 is a cathode.

In addition, the OLED device layer 37 comprises a hole injection layer, a hole transport layer, a emitting layer and an electron-transporting layer (not shown in the FIG. 3) stacked in order from bottom to top, and the low gray color shift adjustment layer 370 is positioned between the electron transport layer and the second electrode (cathode) 38.

Embodiment 3

Figure 4:
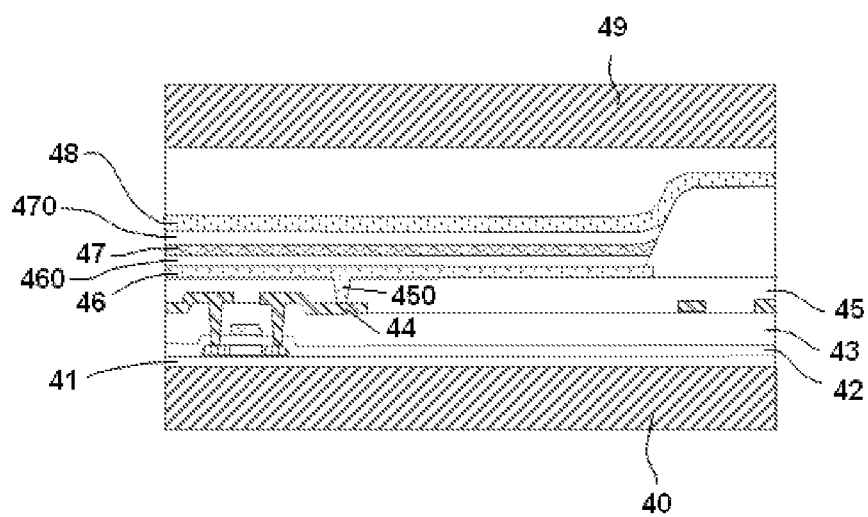

In the embodiments of the disclosure, the technical solution recorded in Embodiment 1 is also applicable for Embodiment 3, so it will not be repeat here, the obvious differences between Embodiment 3 and Embodiment 1 are: the OLED display panel mainly comprises (as shown in FIG. 4):

a substrate 40; and a buffer layer 41, a gate insulating layer 42 and an insulating layer 43 covering on the substrate 40 in order;

a thin-film transistor 44 configured on the substrate 40, and part of the thin-film transistor 44 is positioned between the gate insulating layer 42 and the insulating layer 43;

a planarizing layer 45 configured on the thin-film transistor 44, and part of the thin-film transistor 44 is positioned in the planarizing layer 45; and the planarizing layer 45 comprises a through-hole 450 penetrating the planarizing layer 45 to the thin-film transistor 44;

a first electrode 46 configured on the planarizing layer 45, and electrically connected to the thin-film transistor 44 through the through-hole 450;

a first low gray color shift adjustment layer 460 configured on the first electrode 46, and the current carriers of the first low gray color shift adjustment layer 460 can be successfully injected and transferred to an OLED device layer 47;

the OLED device layer 47 configured on the first electrode 46;

a second low gray color shift adjustment layer 470 configured on the OLED device layer 47, and the current carriers thereof can be successfully injected and transferred to the OLED device layer 47;

a second electrode 48 configured on the OLED device layer 47; and an encapsulating cover 49 configured on the second electrode 48.

Wherein, the first electrode 46 is an anode, the second electrode 48 is a cathode.

In addition, the OLED device layer 47 comprises a hole injection layer, a hole transport layer, a emitting layer and an electron-transporting layer(not shown in the FIG. 3) stacked in order from bottom to top, and the first low gray color shift adjustment layer 460 is positioned between the first electrode (anode) 46 and the hole injection layer; the second low gray color shift adjustment layer 470 is positioned between the electron transport layer and the second electrode (cathode) 48.

Embodiment 4

Based on the above-mentioned OLED display panel structure, the disclosure further provides a manufacturing method of the OLED display panel; the technical solution of Embodiment 1 is also applicable for the present embodiment, so it will not be repeat here, the method mainly comprises:

providing a substrate; and forming a buffer layer, a gate insulating layer and an insulating layer on the substrate in order;

forming a thin-film transistor on the substrate, and part of the thin-film transistor is positioned between the gate insulating layer and the insulating layer;

forming a planarizing layer on the thin-film transistor, part of the thin-film transistor is positioned in the planarizing layer; and forming a through-hole penetrating the planarizing layer to the thin-film transistor;

forming an anode on the planarizing layer, and the anode electrically connected to the thin-film transistor through the through-hole;

forming an OLED device layer on the anode;

forming a cathode on the OLED device layer;

forming an encapsulating cover on the cathode; and forming a low gray color shift adjustment layer between the anode and the OLED device layer, and/or between the OLED device layer and the cathode.

According to the experiment principles of Embodiment 1, the skilled in the art can reduce the electric current passing through the OLED display panel by appropriately adjusting the thickness or doping concentration of the LGAL, thus the brightness of the OLED display panel is reduced, and it makes the Gamma adjustable in low light, and ensures the correctness of the emitting-light chromaticity coordinate and having no color shift under low gray-scale.

In conclusion, the disclosure provides an OLED display panel and a manufacturing method thereof, the technical solutions form a low gray color shift adjustment layer between the anode and the OLED device layer, and/or between the OLED device layer and the cathode during the manufacturing process of the OLED display panel, so as to solve the color shift problem under low gray-scale by adjusting the thickness or doping concentration of the low gray color shift adjustment layer, and improve the accuracy of the emitting color of the OLED panel.

The foregoing is only the preferred embodiments of the disclosure, not thus limiting embodiments and scope of the disclosure, those skilled in the art should be able to realize that the schemes obtained from the content of specification and figures of the disclosure are within the scope of the disclosure.

What is claimed is:

1. An OLED display panel, comprising:
    a substrate;
    a thin-film transistor disposed on the substrate;
    a planarizing layer, disposed on the thin-film transistor, comprising a through-hole penetrating the planarizing layer;
    a first electrode, disposed on the planarizing layer, being electrically connected to the thin-film transistor via the through-hole;
    an OLED device layer disposed on the first electrode;
    a second electrode disposed on the OLED device layer;
    a low gray color shift adjustment layer, disposed between the first electrode and the OLED device layer, and/or between the OLED device layer and the second electrode; and
    an encapsulating cover disposed on the second electrode;
    wherein the low gray color shift adjustment layer is doped with one or more dopants.

2. The OLED display panel according to claim 1, wherein a thickness of the low gray color shift adjustment layer is 0.5~500 nm.

3. The OLED display panel according to claim 1, wherein the first electrode is an anode, and the second electrode is a cathode.

4. The OLED display panel according to claim 3, wherein the anode is a reflective anode, and the cathode is a semi-transparent-and-semireflective cathode.

5. The OLED display panel according to claim 1, wherein the dopants of the low gray color shift adjustment layer are n-type dopants or p-type dopants.

6. The OLED display panel according to claim 5, wherein the p-type dopants comprise HAT-CN, F4-TCNQ, TBAHA, SbC15 or FeC13.

7. The OLED display panel according to claim 5, wherein the n-type dopants comprise alkali metal or alkali metal salt.

8. The OLED display panel according to claim 1, wherein the OLED device layer comprises a hole injection layer, a hole transport layer, a emitting layer and an electron transport layer stacked in order from bottom to top.

9. The OLED display panel according to claim 8, wherein the low gray color shift adjustment layer is positioned between the anode and the hole injection layer, and/or between the electron transport layer and the cathode.

10. An OLED display panel manufacturing method, comprising:
    providing a substrate;
    forming a thin-film transistor on the substrate;
    forming a planarizing layer with a through-hole therein on the thin-film transistor, wherein the through-hole penetrates the planarizing layer;
    forming a first electrode on the planarizing layer to be electrically connected to the thin-film transistor via the through-hole;
    forming an OLED device layer on the first electrode;
    forming a second electrode on the OLED device layer;
    forming an encapsulating cover on the second electrode; and
    forming a low gray color shift adjustment layer between the first electrode and the OLED device layer, and/or between the OLED device layer and the second electrode;
    wherein the low gray color shift adjustment layer comprises one or plural dopants therein.

11. The manufacturing method according to claim 10, wherein a thickness of the low gray color shift adjustment layer is 0.5~500 nm.

12. The manufacturing method according to claim 10, wherein the OLED device layer forming step comprises:
    sequentially forming a hole injection layer, a hole transport layer, an emitting layer and an electron transport layer on the first electrode layer.

13. The manufacturing method according to claim 12, wherein the low gray color shift adjustment layer is formed between the first electrode and the hole injection layer, and/or between the electron transport layer and the second electrode.

14. The manufacturing method according to claim 10, wherein the first electrode is an anode, and the second electrode is a cathode.

15. The manufacturing method according to claim 14, wherein the anode is formed as a reflective anode, and the cathode is formed as a semitransparent-and-semireflective cathode.

16. The manufacturing method according to claim 10, wherein the dopants are p-type dopants or n-type dopants.

17. The manufacturing method according to claim 16, wherein the n-type dopants comprise alkali metal or alkali metal salt.

18. The manufacturing method according to claim 16, wherein the p-type dopants comprise HAT-CN, F4-TCNQ, TBAHA, SbC15 or FeC13.

* * * * *